United States Patent
Bierhuizen

(10) Patent No.: US 9,136,448 B2
(45) Date of Patent: Sep. 15, 2015

(54) SEMICONDUCTOR LIGHT EMITTING DEVICE LAMP THAT EMITS LIGHT AT LARGE ANGLES

(71) Applicant: KONINKLIJKE PHILIPS N.V., Eindhoven (NL)

(72) Inventor: Serge Joel Armand Bierhuizen, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/366,294

(22) PCT Filed: Jan. 3, 2013

(86) PCT No.: PCT/IB2013/050054
§ 371 (c)(1),
(2) Date: Jun. 18, 2014

(87) PCT Pub. No.: WO2013/108143
PCT Pub. Date: Jul. 25, 2013

(65) Prior Publication Data
US 2014/0367709 A1 Dec. 18, 2014

Related U.S. Application Data

(60) Provisional application No. 61/587,156, filed on Jan. 17, 2012.

(51) Int. Cl.
*H01L 33/58* (2010.01)
*H01L 25/075* (2006.01)
(Continued)

(52) U.S. Cl.
CPC ............... *H01L 33/58* (2013.01); *F21K 9/135* (2013.01); *H01L 25/0753* (2013.01); *F21Y 2105/003* (2013.01); *H01L 33/54* (2013.01); *H01L 2933/0091* (2013.01)

(58) Field of Classification Search
CPC ............... H01L 25/0753; H01L 33/58; H01L 2933/0091; H01L 33/54; F21K 9/135; F21Y 2105/003
USPC .......................................................... 257/88
See application file for complete search history.

(56) References Cited

U.S. PATENT DOCUMENTS

| | | |
|---|---|---|
| 7,686,478 B1 | 3/2010 | Hulse |
| 2004/0085766 A1 | 5/2004 | Chen |

(Continued)

FOREIGN PATENT DOCUMENTS

| | | |
|---|---|---|
| DE | 102008025756 A1 | 12/2009 |
| EP | 1327558 A2 | 7/2003 |

(Continued)

OTHER PUBLICATIONS

"Secondary Optics Design Considerations for Superflux LEDs" Lumileds Publication No. AB20-5 Sep. 2002.

*Primary Examiner* — Ermias Woldegeorgis

(57) ABSTRACT

Embodiments of the invention include a plurality of semiconductor light emitting diodes attached to a mount. A plurality of lenses are disposed over the plurality of semiconductor light emitting diodes. A lens disposed over a semiconductor light emitting diode proximate an edge of the mount is rotationally asymmetrical and is shaped such that for a portion of the lens light emitted at an intensity that is half a maximum intensity is emitted at an angle of at least 70° relative to a normal to a top surface of the semiconductor light emitting diode.

9 Claims, 4 Drawing Sheets

(51) Int. Cl.
*F21K 99/00* (2010.01)
*H01L 33/54* (2010.01)
*F21Y 105/00* (2006.01)

(56) References Cited

U.S. PATENT DOCUMENTS

2005/0041436 A1 2/2005 Ishida
2005/0065798 A1 3/2005 Kunstler
2006/0221613 A1* 10/2006 Coushaine et al. ........... 362/249
2009/0050907 A1 2/2009 Yuan
2009/0310356 A1 12/2009 Laporte
2010/0047941 A1 2/2010 Lee
2011/0095671 A1 4/2011 Chu
2011/0266571 A1 11/2011 Zeiler
2012/0001208 A1* 1/2012 Brick et al. .................... 257/89

FOREIGN PATENT DOCUMENTS

EP 1710493 A2 10/2006
WO 0017569 A1 3/2000

\* cited by examiner

SEMICONDUCTOR LIGHT EMITTING DEVICE LAMP THAT EMITS LIGHT AT LARGE ANGLES

CROSS-REFERENCE TO PRIOR APPLICATIONS

This application is the U.S. National Phase application under 35 U.S.C. §371 of International Application No. PCT/IB2013/050054, filed on Jan. 3, 2013, which claims the benefit of U.S. Patent Application No. 61/587,156, filed on Jan. 17, 2012. These applications are hereby incorporated by reference herein.

FIELD OF THE INVENTION

The present invention relates to a plurality of semiconductor light emitting devices with at least one lens configured to emit light at large angles.

BACKGROUND

Semiconductor light-emitting devices including light emitting diodes (LEDs), resonant cavity light emitting diodes (RCLEDs), vertical cavity laser diodes such as surface-emitting lasers (VCSELs), and edge emitting lasers are among the most efficient light sources currently available. Materials systems currently of interest in the manufacture of high-brightness light emitting devices capable of operation across the visible spectrum include Group III V semiconductors, particularly binary, ternary, and quaternary alloys of gallium, aluminum, indium, and nitrogen, also referred to as III nitride materials. Typically, III nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a device described in more detail in U.S. Pat. No. 7,461,948, which is incorporated herein by reference. The device includes a plurality of light emitting diode (LED) dies 102, 104, and 106, each with a different type of secondary optic. Thus, a first type of lens 103 is mounted to the LED die 102, a second type of lens 105 is mounted to the LED die 104, and a third type of lens 107 is mounted to LED 106. The lenses 103, 105, and 107 are configured to produce different light distribution patterns from their respective LEDs 102, 104, and 106. The LEDs 102, 104, and 106 are mounted near each other on a submount 101, but are separated by a distance that is adequate to distinguish the optical centers of each LED die. While three LEDs 102, 104, and 106 are shown in FIG. 1, it should be understood that fewer, e.g., two, or additional LEDs, e.g., four or more, may be used. If desired, a plurality of submounts may be used.

The different light distribution patterns produced by the different types of secondary optics combine to produce an efficient light source having a desired illumination pattern. For example, the first LED may include a lens that produces a light distribution pattern with a maximum intensity at the center while the second LED may use a lens that produces a light distribution pattern with a maximum intensity that surrounds the maximum intensity of the pattern produced by the first LED.

SUMMARY

It is an object of the invention to provide a lamp including semiconductor light emitting diodes that emits light at large angles.

Embodiments of the invention include a plurality of semiconductor light emitting diodes attached to a mount. A plurality of lenses are disposed over the plurality of semiconductor light emitting diodes. A lens disposed over a semiconductor light emitting diode proximate an edge of the mount is rotationally asymmetrical and is shaped such that for a portion of the lens light emitted at an intensity that is half a maximum intensity is emitted at an angle of at least 70° relative to a normal to a top surface of the semiconductor light emitting diode.

A method according embodiments of the invention includes forming a plurality of lenses over a plurality of semiconductor light emitting diodes attached to a mount. A first lens formed over a first semiconductor light emitting diode has a different shape than a second lens formed over a second semiconductor light emitting diode. The first semiconductor light emitting diode is located closer to an edge of the mount than the second semiconductor light emitting diode. The first lens is rotationally asymmetrical and is shaped such that for a portion of the first lens, light emitted at an intensity that is half a maximum intensity is emitted at an angle of at least 70° relative to a normal to a top surface of the first semiconductor light emitting diode.

DETAILED DESCRIPTION

Figure 1:
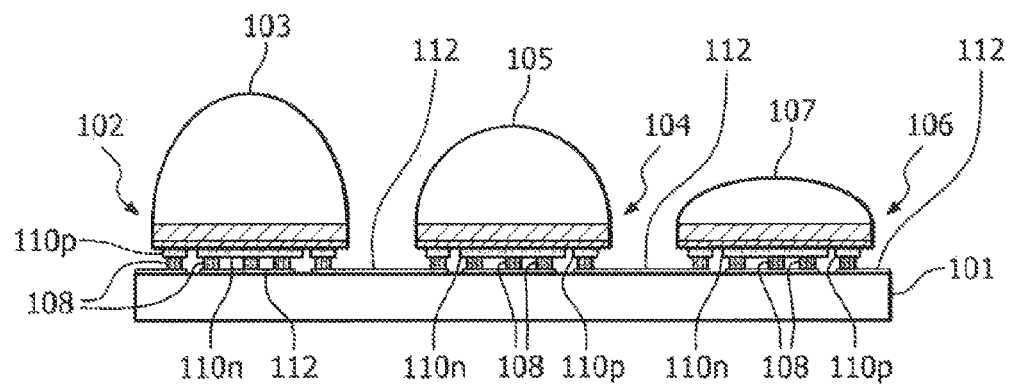
FIG. 1 illustrates a plurality of light emitting diodes with secondary optics that produce different light distribution patterns.
Figure 2:
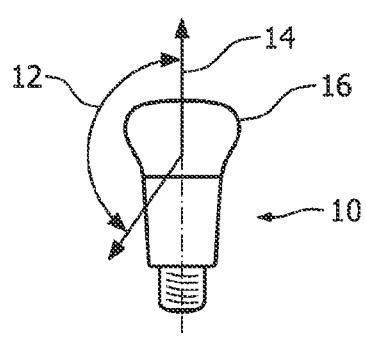
FIG. 2 illustrates large angle light emission from a lamp including LEDs.

LEDs are attractive, high efficiency alternatives to conventional incandescent light bulbs. In order to mimic the radiation profile of a conventional incandescent light bulb, an LED lamp must emit light at large angles. For example, as illustrated in FIG. 2, in order to meet the requirements for Energy Star designation, an LED lamp 10 must emit light at angles 12 up to 135° relative to a major axis 14 of the lamp 10. In commercially available devices, a secondary lens 16 is placed over an array of LEDs (not shown in FIG. 2) to create the desired large angle emission. Such secondary lenses 16 add cost and complexity to the lamp 10 and can reduce efficiency.

In embodiments of the invention, lenses that create large angle light are formed over LEDs at the edge of an array used in an LED lamp. Though the examples below refer to III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used in embodiments of the invention.

Figure 3:
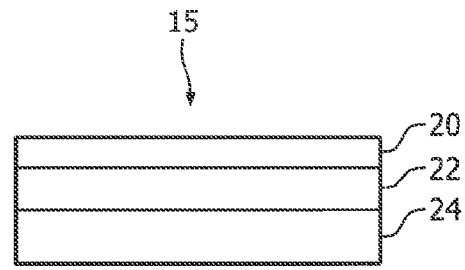
FIG. 3 is a simplified cross sectional view of a light emitting device including a semiconductor structure attached to a support.

FIG. 3 is a cross sectional view of a portion of a semiconductor light emitting device such as an LED attached to a support. To form the light emitting device 15 of FIG. 3, a semiconductor structure 20 is first grown on a growth substrate (not shown in FIG. 3) as is known in the art. The growth substrate may be any suitable substrate such as, for example, sapphire, SiC, Si, GaN, or composite substrates. The semiconductor structure 20 includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 µm in some embodiments and less than 6 µm in some embodiments.

A metal p-contact is formed on the p-type region. If a majority of light is directed out of the semiconductor structure through a surface opposite the p-contact, such as in a flip chip device, the p-contact may be reflective. A flip chip device may be formed by patterning the semiconductor structure by standard photolithographic operations and etching the semiconductor structure to remove a portion of the entire thickness of the p-type region and a portion of the entire thickness of the light emitting region, to form a mesa which reveals a surface of the n-type region on which a metal n-contact is formed. The mesa and p- and n-contacts may be formed in any suitable manner. Forming the mesa and p- and n-contacts is well known to a person of skill in the art and is not illustrated in FIG. 3.

The p- and n-contacts may be redistributed by a stack of insulating layers and metals as is known in the art to form at least two large electrical pads. One of the electrical pads is electrically connected to the p-type region of the semiconductor structure 20 and the other of the electrical pads is electrically connected to the n-type region of the semiconductor structure 20. Electrical pads may be any suitable conductive material including, for example, copper, gold, and alloys. The electrical pads are electrically isolated from each other by a gap which may be filled with an insulating material such as a dielectric, air, or other ambient gas. The p- and n-contacts, the metal/dielectric stack to redistribute the contacts, and the electrical pads are well known in the art and are illustrated in FIG. 3 as electrical connection structure 22.

The semiconductor structure 20 is connected to a support 24 through electrical connection structure 22. Support 24 is a structure that mechanically supports semiconductor structure 20. In some embodiments, support 24 is connected to semiconductor structure 20 at a wafer level, such that support 24 is diced at the same time as semiconductor structure 20 and is therefore the same width as semiconductor structure 20, as illustrated in FIG. 3. In some embodiments, a wafer of semiconductor devices is diced first, then individual devices or groups of devices are connected to individual supports 24 or a wafer of supports, after dicing the semiconductor wafer. In these embodiments, support 24 may be wider than semiconductor structure 20. In some embodiments, support 24 is a self-supporting structure suitable to attach the semiconductor light emitting device to a substrate such as a PC board. For example, the surface of support 24 opposite semiconductor structure 20 (the bottom surface of support 24 in FIG. 3) may be reflow-solderable. Any suitable support may be used. Examples of suitable supports 24 include an insulating or semi-insulating wafer with conductive vias for forming electrical connections to the electrical connection structure 22, such as a silicon wafer, thick metal bonding pads formed on electrical connection structure 22, for example by plating, or a ceramic, metal, or any other suitable mount.

Figure 4:
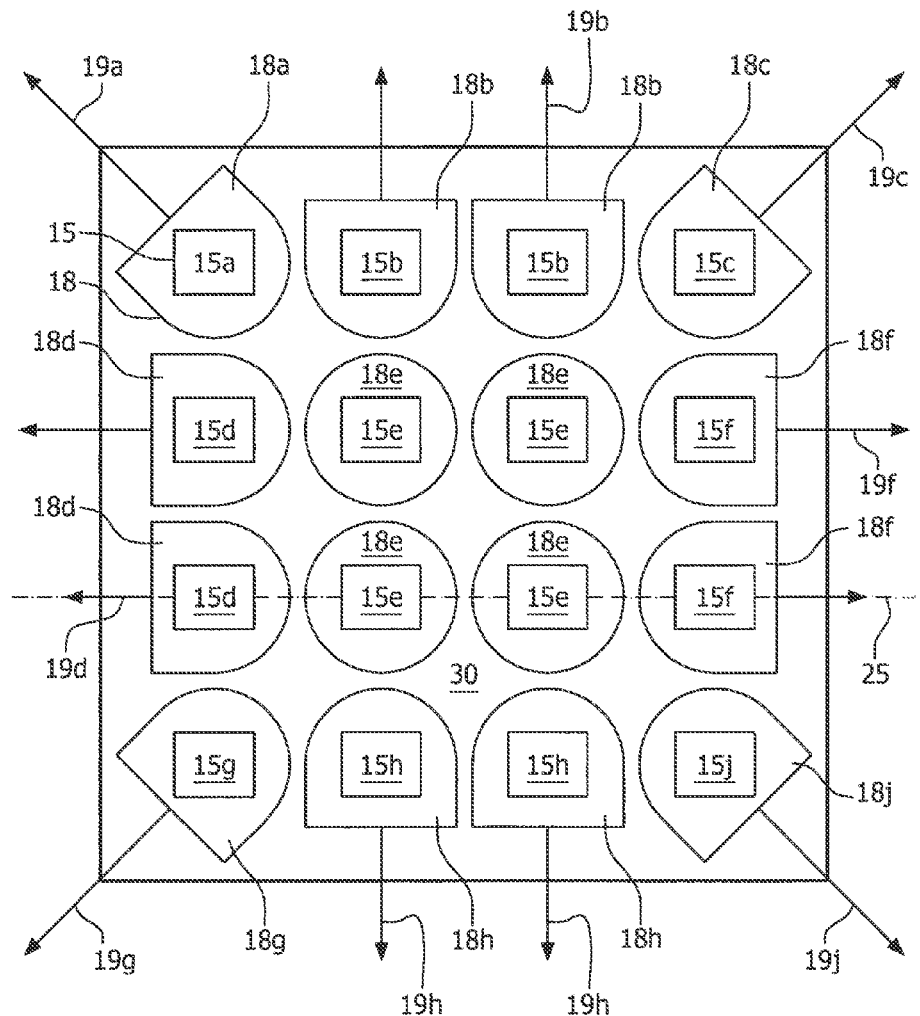
FIG. 4 is a plan view of an array of devices of FIG. 3 attached to a mount.

In order to use the light emitting devices 15 illustrated in FIG. 3 in an LED lamp, one or more devices 15 are mounted on a mount 30, as illustrated in the top view of FIG. 4. Mount 30 may be any suitable structure such as a PC board or a silicon wafer or portion of a wafer. Though an array of 16 devices 15 is illustrated in FIG. 4, more or fewer devices 15 may be used, and the devices need not be arranged in an evenly-spaced array.

Lenses 18 are disposed over each device 15. Lenses 18 may be formed and disposed over devices 15 by any suitable technique. Lenses 18 may be formed over individual devices 15 before or after attaching the devices to mount 30. In some embodiments, lenses 18 are pre-formed lenses that are glued or adhered to devices 15 and/or mount 30, or otherwise disposed over devices 15. Alternatively, lenses 18 may be formed in a low pressure overmolding process, as follows: A mold with indentations corresponding to the positions of the devices 15 on the mount 30 is provided. The indentations are filled with a liquid, optically transparent material, such as silicone, which when cured forms a hardened lens material. The shape of the indentations will be the shape of the lens. The mold and the mount with devices 15 are brought together so that each device resides within the liquid lens material in an associated indentation. The mold is then heated to cure (harden) the lens material. The mold and the mount are then separated, leaving a lens 18 over each device 15. Alternatively, lenses 18 may be formed by high pressure injection molding, where the liquid material is injected at high pressure after an empty mold is encased around the object to be encapsulated.

Lenses of different shapes are formed over different devices 15 in the array on mount 30. For example, lenses 18e formed over devices 15e at the center of the array are shaped to direct light out the top of the devices 15e, i.e. perpendicularly out of the plane of FIG. 4. In some embodiments, lenses 18e are shaped such that a majority of light escapes the lens at angles of 45° or less relative to a normal to a top surface of the device. Lenses 18b formed over the devices 15b on the side of the array (the top center two devices as illustrated in FIG. 4) are shaped to direct light 19b out the side of the array and at large angles. Lenses 18d formed over the devices 15d on the side of the array (the two devices in the center of the left hand column of devices as illustrated in FIG. 4) are shaped to direct light 19d out the side of the array and at large angles. Lenses 18f formed over the devices 15f on the side of the array (the two devices in the center of the right hand column of devices as illustrated in FIG. 4) are shaped to direct light 19f out the side of the array and at large angles. Lenses 18h formed over the devices 15h on the side of the array (the bottom center two devices as illustrated in FIG. 4) are shaped to direct light 19h out the side of the array and at large angles. Lenses 18a, 18c, 18g, and 18j formed over the devices 15a, 15c, 15g, and 15j at the corners of the array are shaped to direct light 19a, 19c, 19g, and 19j out the corners of the array and at large angles.

Figure 5A:
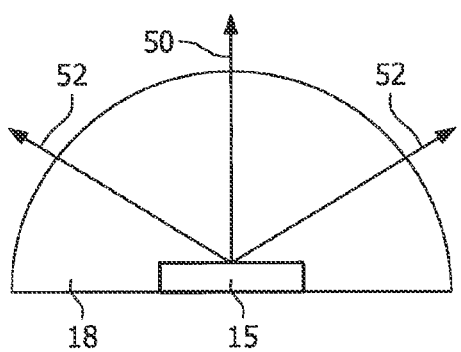
FIG. 5A is a cross sectional view of a lens formed over a device in the middle of the array of FIG. 4.

FIG. 5A is a cross sectional view of an example of device 15 and a lens 18 which may be located at the center of the array illustrated in FIG. 4 (i.e. devices 15e and lenses 18e). A lens may be characterized by a half-maximum angle, defined as an angle relative to a normal to the top surface of device 15 at which the intensity of emitted light is half of the maximum intensity of emitted light. Line 50 in FIG. 5A is the normal to the top surface of device 15. FIG. 5A illustrates a device emitting light in a Lambertian pattern. In a Lambertian pattern, the light is evenly distributed in a cosine curve, such that the half maximum 52 is at 60° relative to normal 50. The lens illustrated in FIG. 5A is rotationally symmetrical, such that the half maximum angle is substantially the same in any direction (though there may be minor variations in the half maximum angle due to the shape of device 15). For example, the half maximum angle 52 is the same on the right and left sides of the lens in the cross section illustrated in FIG. 5A.

Figure 5B:
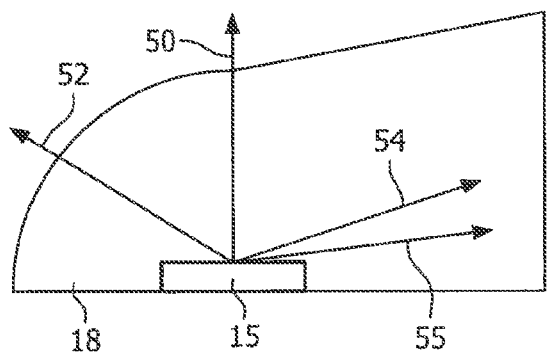
FIGS. 5B and 5C are cross sectional views of two examples of lenses that may be formed over devices at the edge of the array of FIG. 4.
Figure 5C:
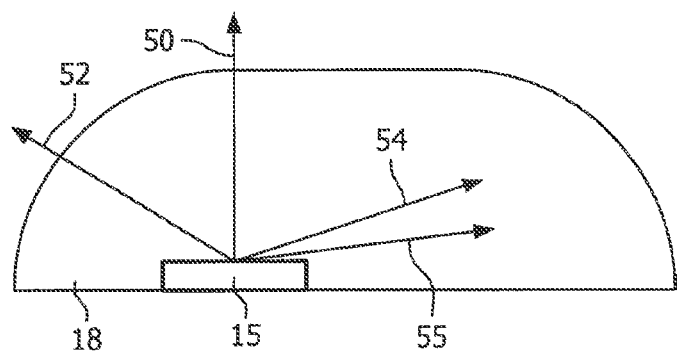

FIGS. 5B and 5C are cross sectional views of examples of devices 15 and lenses 18 which may be located at the edges of the array illustrated in FIG. 4 (i.e. devices 15a, 15b, 15c, 15d, 15f, 15g, 15h, and 15j). The lenses 18 of FIGS. 5B and 5C are not rotationally symmetrical. The left side of both of the lenses in FIGS. 5B and 5C emits light in a Lambertian pattern, such that the half maximum 52 is at 60° relative to normal 50. The right side of both of the lenses in FIGS. 5B and 5C has a larger lateral extent than the left side of both of the lenses in FIGS. 5B and 5C. In FIG. 5B, the right side of the lens extends upward toward a substantially vertical sidewall at the right edge of the lens. In FIG. 5C, the right side of the lens extends outward toward the right edge of the lens, which curves downward. The right side of the lenses in FIGS. 5B and 5C emits light at larger angles, such that the half maximum angle may be at least 70° relative to normal 50, as illustrated by ray 54, or at least 80° relative to normal 50, as illustrated by ray 55. The position of the portion of the lens that emits light at a larger half maximum angle is indicated in FIG. 4 as a flat side of lenses 18a, 18b, 18c, 18d, 18f, 18g, 18h, and 18j. The lenses thus direct light out the sides of the array at half-maximum angles that are larger than 60°.

Figure 6:
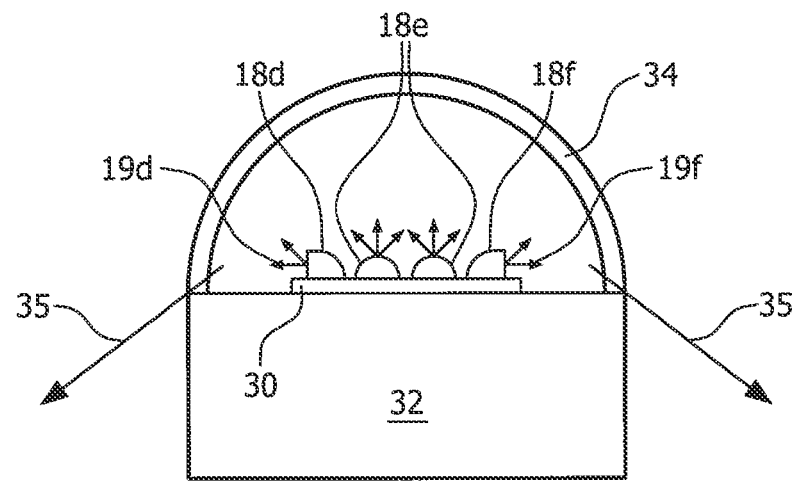
FIG. 6 is a cross sectional view of a lamp according to embodiments of the invention.

FIG. 6 is a cross sectional view of a lamp including the array illustrated in FIG. 4, taken at axis 25 illustrated in FIG. 4. Mount 30 is attached to a heat sink 32. An outer shell 34 is disposed over the array of devices 15. Outer shell 34 may be, for example, any suitable transparent material such as molded plastic or glass. Outer shell 34 may include a material to cause scattering, such as particles of $TiO_2$, or may be roughened, patterned, or textured to cause scattering. The lenses 18d and 18f over the devices at the sides of the array are shaped to direct light 19d and 19f out the sides of the array at half-maximum angles of at least 70° in some embodiments and at least 80° in some embodiments, as described above. The shape of the lenses 18d and 18f combined with scattering provided by outer shell 34 cause light 35 to be emitted at large angles, for example angles of at least 90° relative to a normal to the top surface of heat sink 32 and/or between 90° and 135° relative to a normal to the top surface of heat sink 32. In some embodiments, an amount of light emitted at 135° relative to a normal to the top surface of heat sink 32 is at least 5% of the amount of light emitted at the angle where the intensity of light emitted is at a maximum.

Figure 7:
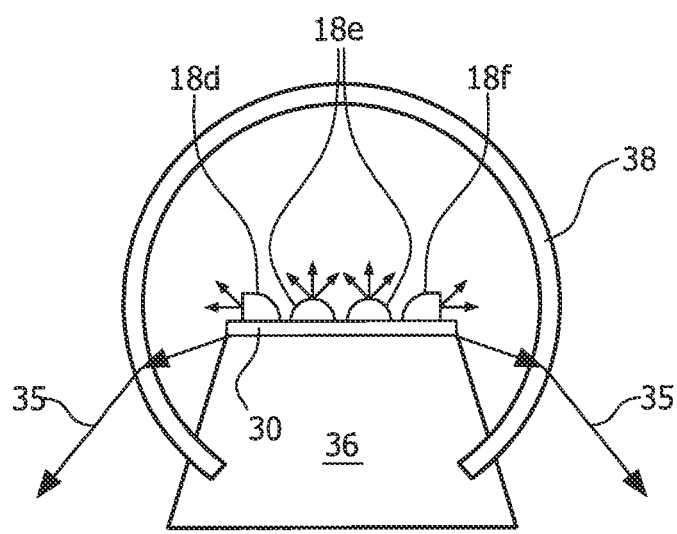
FIG. 7 is a cross sectional view of an alternative lamp according to embodiments of the invention.

FIG. 7 is a cross sectional view of an alternative lamp including the array illustrated in FIG. 4, taken at axis 25 illustrated in FIG. 4. Mount 30 is attached to a heat sink 36. Heat sink 36 is shaped such that outer shell 38 extends past the sides of the array and past the sides of heat sink 36. Outer shell 38 may be, for example, any suitable transparent material such as molded plastic or glass. Outer shell 38 may include a material to cause scattering, such as particles of $TiO_2$, or may be roughened, patterned, or textured to cause scattering. The lenses 18d and 18f over the devices at the sides of the array are shaped to direct light 19d and 19f out the sides of the array at half-maximum angles of at least 70° in some embodiments and at least 80° in some embodiments, as described above. The shape of the lenses 18d and 18f combined with scattering provided by outer shell 38 cause light 35 to be emitted at large angles, for example angles of at least 90° relative to a normal to the top surface of heat sink 36 and/or between 90° and 135° relative to a normal to the top surface of heat sink 36. In some embodiments, an amount of light emitted at 135° relative to a normal to the top surface of heat sink 36 is at least 5% of the amount of light emitted at the angle where the intensity of light emitted is at a maximum.

In some embodiments, the lamps of FIGS. 6 and 7 are configured such that the amount of light emitted at any angle is within ±20% of the average intensity between 0° and 135°, as is required for a device to be designated an Energy Star device.

The structures illustrated in FIGS. 4, 6, and 7 may be incorporated into a package that is compatible with sockets for a conventional light bulb, such as the package illustrated in FIG. 2. The outer shell illustrated in FIGS. 6 and 7 may replace the lens illustrated in FIG. 2.

Having described the invention in detail, those skilled in the art will appreciate that, given the present disclosure, modifications may be made to the invention without departing from the spirit of the inventive concept described herein. For example, different elements of different embodiments may be combined to form new embodiments. Therefore, it is not intended that the scope of the invention be limited to the specific embodiments illustrated and described.

The invention claimed is:

1. A structure comprising:
    a plurality of semiconductor light emitting diodes attached to a mount, the mount having a plurality of edges and a center; and
    one or more first lenses disposed over a first subset of the semiconductor light emitting diodes proximate one of the edges of the mount wherein the first lenses are rotationally asymmetrical; and
    one or more second lenses disposed over second subset of the plurality of semiconductor light emitting diodes proximate the center of the mount wherein the second lenses are rotationally symmetrical,
    wherein the first lenses are shaped such that for a portion of the lens, light emitted at an intensity that is half a maximum intensity is emitted at an angle of at least 80° relative to a normal to a top surface of the semiconductor light emitting diode.

2. The structure of claim 1 wherein the first lenses are shaped such that for a portion of the lens, light emitted at an intensity that is half a maximum intensity is emitted at an angle less than 70° relative to a normal to a top surface of the semiconductor light emitting diode.

3. A structure comprising:
a plurality of semiconductor light emitting diodes attached to a mount, the mount having a plurality of edges and a center; and
one or more first lenses disposed over a first subset of the semiconductor light emitting diodes proximate one of the edges of the mount wherein the first lenses are rotationally asymmetrical;
one or more second lenses disposed over second subset of the plurality of semiconductor light emitting diodes proximate the center of the mount wherein the second lenses are rotationally symmetrical; and
a shell disposed over the plurality of light emitting diodes, wherein the structure is configured such that light escapes the shell at an angle of 135° relative to a normal to a top surface of the mount;
wherein an amount of light emitted at an angle of 135° relative to the normal to the top surface of the mount is at least 5% of an amount of light emitted at an angle where an intensity of light emitted is at a maximum.

4. The structure of claim 3 wherein the shell comprises a material that causes scattering of light.

5. The structure of claim 3 wherein the shell extends below a bottom of the mount.

6. A device comprising:
a plurality of light emitting diodes attached to a top surface of a mount embedded in a plane, the mount having a plurality of edges and a center; and
one or more first lenses disposed over a first subset of the light emitting diodes wherein the first lenses are rotationally asymmetrical; and
one or more second lenses disposed over second subset of the plurality of light emitting diodes wherein the second lenses are rotationally symmetrical,
wherein the first and second sent of lenses are arranged to direct light above and below the plane.

7. The structure of claim 6 further comprising a shell disposed over the plurality of light emitting diodes, wherein the combination of the first and second lenses and the shell direct light above and below the plane.

8. The structure of claim 7 wherein the shell comprises a material that causes scattering of light.

9. The structure of claim 7 wherein the shell extends below the plane.

* * * * *